United States Patent
Ganguli et al.

(10) Patent No.: US 11,404,728 B2
(45) Date of Patent: Aug. 2, 2022

(54) METHOD AND SYSTEM TO SEPARATE OPTICALLY MEASURED COUPLED PARAMETERS

(71) Applicant: Palo Alto Research Center Incorporated, Palo Alto, CA (US)

(72) Inventors: Anurag Ganguli, Milpitas, CA (US); Julian Schwartz, Palo Alto, CA (US); Ajay Raghavan, Mountain View, CA (US); Peter Kiesel, Palo Alto, CA (US); Bhaskar Saha, Redwood City, CA (US); Saroj Sahu, Fremont, CA (US); Lars Wilko Sommer, Bretten (DE)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 89 days.

(21) Appl. No.: 17/106,726

(22) Filed: Nov. 30, 2020

(65) Prior Publication Data

US 2021/0167427 A1     Jun. 3, 2021

Related U.S. Application Data

(62) Division of application No. 14/810,919, filed on Jul. 28, 2015, now Pat. No. 10,854,932.

(51) Int. Cl.
*H01M 10/42* (2006.01)
*H01M 10/48* (2006.01)
(Continued)

(52) U.S. Cl.
CPC ........ *H01M 10/4285* (2013.01); *G01D 3/036* (2013.01); *G01D 5/353* (2013.01);
(Continued)

(58) Field of Classification Search
CPC ............. H01M 10/4285; H01M 10/48; H01M 10/486; H01M 10/425; G01R 31/392
See application file for complete search history.

(56) References Cited

U.S. PATENT DOCUMENTS

| | | |
|---|---|---|
| 6,256,090 B1 | 7/2001 | Chen et al. |
| 6,668,105 B2 | 12/2003 | Chen et al. |

(Continued)

OTHER PUBLICATIONS

Yang et al., "Real-time temperature measurement with fiber Bragg sensors in lithium batteries for safety usage", Measurement, 36, 2013, pp. 3166-3172.

(Continued)

*Primary Examiner* — Stewart A Fraser
(74) *Attorney, Agent, or Firm* — Mueting Raasch Group

(57) ABSTRACT

A system includes a first optical sensor sensitive to both a parameter of interest, Parameter1, and at least one confounding parameter, Parameter2 and a second optical sensor sensitive only to the confounding parameter. Measurement circuitry measures $M_1$ in response to light scattered by the first optical sensor, where $M_1$=value of Parameter1+K*value of Parameter2. The measurement circuitry also measures $M_2$ in response to light scattered by the second optical sensor, where $M_2$=value of Parameter2. Compensation circuitry determines a compensation factor, K, for the confounding parameter based on measurements of $M_1$ and $M_2$ taken over multiple load/unload cycles or over one or more thermal cycles. The compensation factor is used to determine the parameter of interest.

14 Claims, 14 Drawing Sheets

(51) Int. Cl.
   *G01R 31/392*   (2019.01)
   *G01L 1/24*   (2006.01)
   *G01D 3/036*   (2006.01)
   *G01D 5/353*   (2006.01)

(52) U.S. Cl.
   CPC ............ *G01L 1/246* (2013.01); *G01R 31/392* (2019.01); *H01M 10/48* (2013.01); *H01M 10/486* (2013.01); *H01M 10/425* (2013.01)

(56) References Cited

U.S. PATENT DOCUMENTS

| | | | |
|---|---|---|---|
| 9,203,122 | B2 | 12/2015 | Raghavan et al. |
| 9,356,325 | B1 | 5/2016 | Poirier |
| 2015/0270584 | A1* | 9/2015 | Saunders .......... H01M 10/4285 324/426 |
| 2016/0013522 | A1* | 1/2016 | Morrow ............... G01M 11/086 324/426 |
| 2016/0240897 | A1* | 8/2016 | Saunders ............... G01N 21/59 |

OTHER PUBLICATIONS

Zhao et al., "Discrimination methods and demodulation techniques for fiber Bragg grating sensors", Optics and Lasers in Engineering, 41, 2004, pp. 1-18.

* cited by examiner

METHOD AND SYSTEM TO SEPARATE OPTICALLY MEASURED COUPLED PARAMETERS

RELATED APPLICATIONS

This application is a divisional of U.S. patent application Ser. No. 14/810,919, filed Jul. 28, 2015, to which priority is claimed pursuant to 35 U.S.C. § 119(e), and which is incorporated herein by reference in its entirety.

STATEMENT REGARDING FEDERALLY SPONSORED RESEARCH AND DEVELOPMENT

This invention was made with government support under contract DE-AR0000274 awarded by ARPA-E (Advanced Research Projects Agency—Energy). The government has certain rights in the invention.

TECHNICAL FIELD

This disclosure relates generally to systems that use optical sensors that provide coupled parameter measurements and to related methods and devices.

BACKGROUND

Optical sensors such as fiber Bragg grating (FBG) sensors offer a low cost, compact, and robust sensing mechanism for measurement of a variety of quantities such as strain, temperature, chemical composition, electric current, etc. In many cases, the sensing environment presents changes in more than one quantity at the same time. For example, in some scenarios, thermal changes occur together with structural changes (e.g., as measured by strain). Alternatively or additionally, chemical changes might happen at the same time as thermal changes. Thus, measurements obtained from optical sensors can be a combination of changes in one or more quantities.

BRIEF SUMMARY

Some embodiments are directed to a system that includes one or more fiber optic cables arranged within or on portions of a battery. At least one fiber optic cable includes at least a first optical sensor sensitive to both a parameter of interest, Parameter1, and a confounding parameter, Parameter2. At least one fiber optic cable includes a second optical sensor sensitive only to the confounding parameter. The system includes measurement circuitry is configured to measure $M_1$ in response to light scattered by the first optical sensor, where $M_1$=value of Parameter1+K*value of Parameter2. The measurement circuitry is also configured to measure $M_2$ in response to light scattered by the second optical sensor, where $M_2$=value of Parameter2. The system includes compensation circuitry configured to determine a compensation factor, K, for the confounding parameter based on measurements of $M_1$ and $M_2$ taken over multiple charge/discharge cycles or over one or more thermal cycles of the battery.

Some embodiments involve a method for determining a compensation factor for decoupling coupled parameters sensed using optical sensors. Light scattered by a first optical sensor on or within a battery is sensed and light scattered by a second optical sensor disposed one or within the battery is sensed. The battery is subjected to charge/discharge cycling or thermal cycling. During the cycling, $M_1$ is measured in response to light scattered by the first optical sensor and $M_2$ is measured in response to light scattered by the second optical sensor, where $M_1$=value of Parameter1+K*value of Parameter2 and $M_2$=value of Parameter 2. Parameter1 is a parameter of interest and Parameter2 is a confounding parameter. A compensation factor, K, for the confounding parameter is determined based on the measurements of $M_1$ and $M_2$ during the cycling.

According to some embodiments, one or more fiber optic cables are arranged within or on a mechanical structure. At least one fiber optic cable includes at least a first optical sensor sensitive to both a parameter of interest, Parameter1, and a confounding parameter, Parameter2. At least one fiber optic cable includes a second optical sensor sensitive only to the confounding parameter. Measurement circuitry is configured to measure $M_1$ in response to light scattered by the first optical sensor, where $M_1$=a value of Parameter1 plus K*a value of Parameter2. The measurement circuitry is configured to measure $M_2$ in response to light scattered by the second optical sensor, where $M_2$=a value of Parameter2.

Compensation circuitry is configured to determine a compensation factor, K, for the confounding parameter based on measurements of $M_1$ and $M_2$ taken over multiple load/unload cycles or over one or more thermal cycles of the structure.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Figure 1:
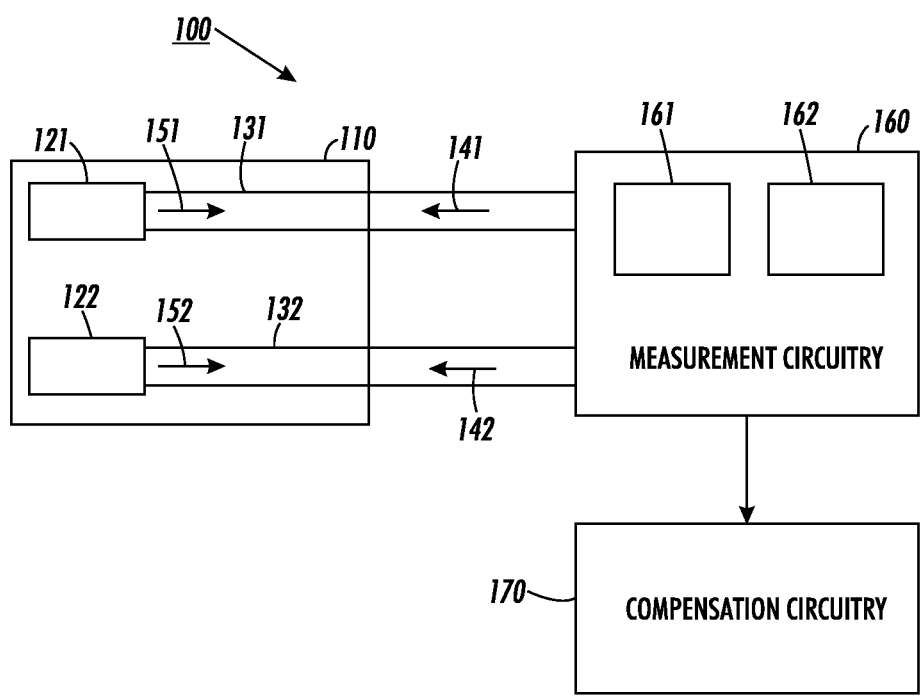
FIG. 1 is a block diagram of a system configured to measure outputs $M_1$ and $M_2$ from two optical sensors disposed in or on a battery and to determine the compensation factor K for the coupled measurement $M_1$ in accordance with some embodiments.

Embodiments described herein relate to systems and methods to separate measurements of coupled parameters sensed by optical sensors into constituent decoupled values and to use the decoupled values to determine the state of health and/or to manage mechanical structures.

As an example, consider a lithium ion battery as a mechanical structure. Lithium-ion batteries have grown increasingly popular in recent years with widespread use in consumer electronics and electric vehicles. More recently, they have also been used in commercial aircraft. Lithium ion batteries, however, are used conservatively. In other words, their capacities remain underutilized, and their operating voltage and current limits are also set conservatively. This is because lithium ion batteries can degrade if not operated within their performance limits, and can sometimes fail catastrophically leading to potential safety issues in their environment of operation. Measurement of external battery parameters such as voltage and current may not provide accurate information about the state of health of the battery. Strain measurements, e.g., taken internally within the battery, potentially provide richer information about the battery state. Fiber optic sensors (e.g., FBG sensors) are one of the most effective sensors to measure strain. However measurement of strain using a FBG sensor is complicated by concurrent changes in the FBG sensor output due to changes in other parameters, such as temperature. Thus, for some measurements, strain and temperature are coupled parameters, where strain is the parameter of interest and temperature is a confounding parameter. Alternatively, in some measurements temperature is the parameter of interest with strain being the confounding parameter. Strain and current, temperature and current, temperature and chemical composition, strain and chemical composition are additional examples of coupled parameters, where the first parameter listed is the parameter of interest and the second parameter is a confounding parameter.

The problem of coupled parameters when using optical sensors extends beyond lithium ion batters or batteries in general to physical systems, and/or cyber physical systems. For example, strain and temperature are coupled parameters for a variety of mechanical structures, e.g., load bearing support structures such as bridge supports, trusses, aircraft wings, etc. Although the examples provided below refer to a battery as the system from which measurements are taken and the compensation factors are determined, it will be appreciated that the concepts disclosed herein are also applicable to other systems.

Assume that a parameter $M_1$ can be measured using an optical sensor, wherein $M_1$ is a combination of two parameters, one parameter (Parameter1) being the parameter of interest and at least one other parameter (Parameter2) being a parameter that confounds the measurement of the first parameter and is referred to herein as the confounding parameter. The quantity measured from the FBG sensor is: $M_1$=value of Parameter1+K*value of Parameter2, where K is an unknown compensation factor.

Embodiments disclosed herein describe methods and systems to determine the value of K and to recover the values of Parameter 1 and Parameter 2. Without loss of generality to other subsystems, some embodiments of this disclosure describe systems and methods for determining values K, Parameter 1, and/or Parameter2 using the example of strain and temperature within the context of lithium ion batteries. The examples provided illustrate systems and methods for determining a compensation factor for the coupled measurement wherein there is one confounding parameter. It will be appreciated that there may be multiple confounding parameters for each parameter of interest. The methods and systems discussed below are also applicable to the determination of compensation factors $K_2$, $K_3$, $K_4$, ... $K_N$ for multiple confounding parameters, Parameter2, Parameter3, Parameter4, ..., ParameterN, where $M_1$=value of Parameter1+$K_2$*Parameter2+$K_3$*Parameter3+$K_4$*Parameter4+ ... $K_N$*ParameterN. In a scenario where multiple confounding parameters for a parameter of interest, Parameter1, are present, the system includes multiple sensors, sensor2, sensor3, ... sensorN sensitive, respectively, only to Parameter2, Paramter3, ... ParameterN.

Measurements of strain in a lithium ion battery can be obtained by bonding FBG sensors to a battery cell, e.g., either bonded externally to the battery cell skin or bonded internally to the battery. In this configuration, a measurement $M_1$ obtained from a first sensor is a linear combination of strain and temperature, where strain is a parameter of interest and temperature is a confounding parameter, $M_1$=Strain+K*Temperature.

It is possible to attach a second sensor in such a way such that only the temperature can be measured, e.g., by placing the second sensor loosely in the battery in a way that it is not affected or is minimally affected by strain. In this scenario, the second sensor provides a second measurement, $M_2$ Temperature.

Using measurements $M_1$ and $M_2$, strain can be determined if the temperature compensation factor K is known. Embodiments disclosed herein provide systems and methods for determining K, for determining the state of health of mechanical structures and/or for managing mechanical structures based on the determination of K.

FIG. 1 is a block diagram of a system 100 configured to measure outputs $M_1$ and $M_2$ from two optical sensors disposed in or on a battery 110 and to determine the compensation factor K for the coupled measurement $M_1$. System 100 includes sensors 121, 122 disposed in, on, or about the battery 110, wherein FBG sensor 121 is arranged so that FBG sensor 121 is affected by both strain and temperature and FBG sensor 122 is arranged so that FBG sensor 122 is affected by temperature and is not affected or is minimally affected by strain. Although the sensors 121, 122 are shown disposed on two separate waveguides, the sensors may alternatively be disposed on a single waveguide wherein the outputs of the sensors are separately discernable, e.g., multiplexed.

FBG sensor 121 and FBG sensor 122 are optically coupled to measurement circuitry 160 by optical fiber 131 and optical fiber 132, respectively. Measurement circuitry includes a light source 161 configured to provide excitation light 141, 142 to the FBG sensors 121, 122 through optical fibers 131, 132. A portion of the excitation light 141, 142 is scattered by the FBG sensors 121, 122. The wavelengths of the portion 151 of excitation light scattered by FBG sensor 121 is dependent on strain and temperature. The wavelengths of the portion 152 of excitation light scattered by FBG sensor 122 is dependent on temperature. The measurement circuitry 160 includes photodetector circuitry 162 comprising one or more photodetectors configured to detect the wavelengths of the scattered light 151, 152. The measurement circuitry 160 detects shifts in the wavelengths of the scattered light 151, 152 as the measurements $M_1$ and $M_2$. The measurement circuitry 160 provides an electrical output that includes measurements $M_1$ and $M_2$.

The measurement circuitry 160 is electrically coupled to compensation circuitry 170 and the electrical output signal from the measurement circuitry 160 provides the measurements $M_1$ and $M_2$ to the compensation circuitry 170 for analysis. The compensation circuitry 170, which may be implemented as a processor or microprocessor, for example, determines a compensation factor K, e.g., an optimal compensation factor ($K_{opt}$) as determined according to the exemplary processes disclosed in more detail below. The compensation circuitry can use the optimal value of K and $M_2$ to determine strain from the measurement $M_1$.

Figure 2:
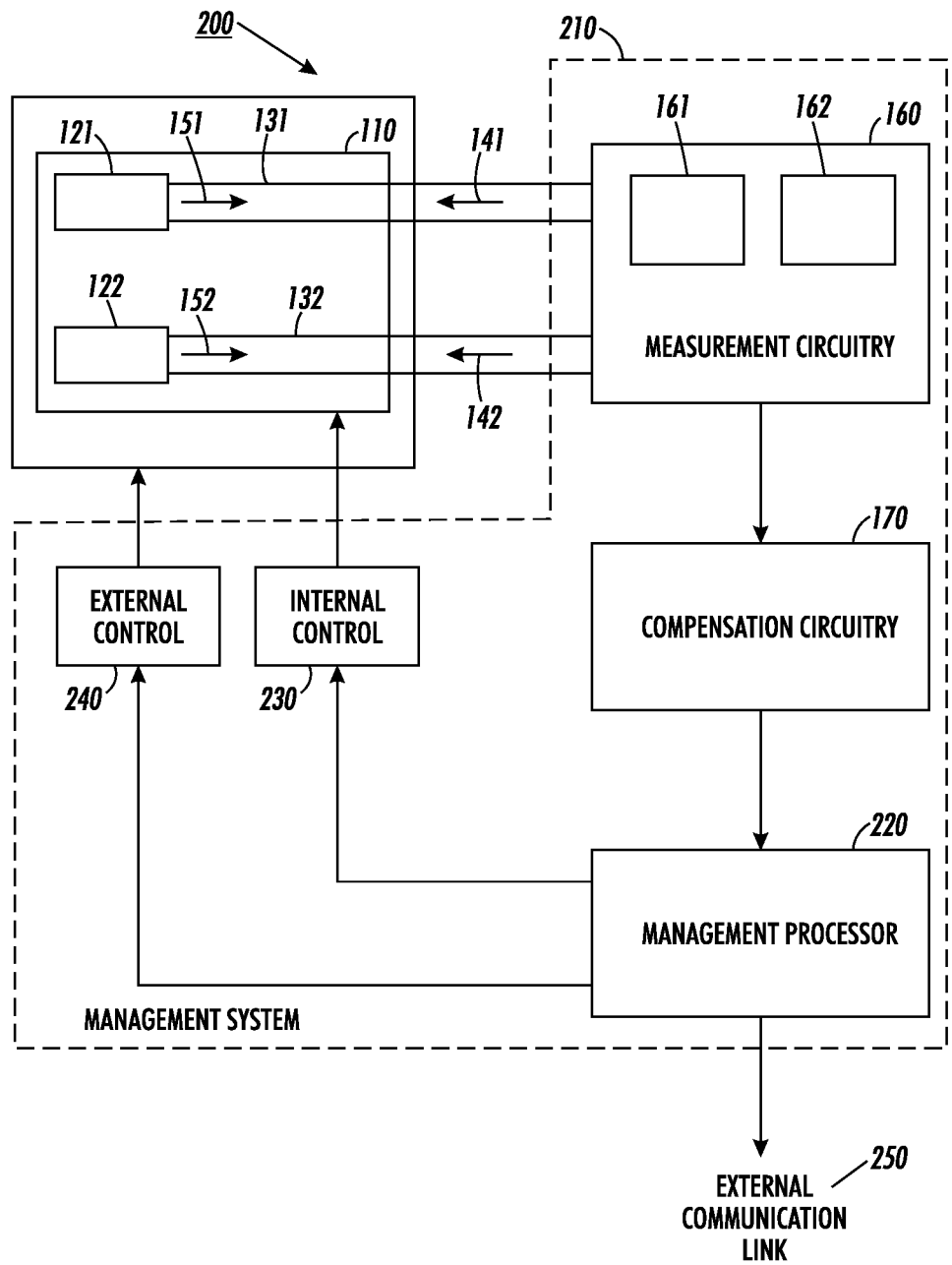
FIG. 2 is block diagram of a management system for a mechanical structure.

FIG. 2 is a block diagram of a system 200 that includes some of the features of the system of FIG. 1, along with additional optional features for monitoring and/or management of the battery (or other mechanical structure). The compensation circuitry 170 provides an output that includes the temperature and/or strain measurements to a management processor 220. The management processor 220 uses these measurements and optionally other measurements to control the operation and environment of the battery using the charge/discharge control circuitry 230 and/or the environmental control circuitry 240. Collectively the FBG sensors 121, 122, the fiber optic cables 131, 132, detection circuitry 160, compensation circuitry 170, management processor 220, internal charge/discharge control circuitry 230, and external environmental control circuitry 240 are components of a battery management system 210.

The management system 210 operates to monitor the state of charge of the battery, the state of health of the battery, e.g., monitoring using the measured strain and temperature values and/or other parameter values, e.g., external parameters such as voltage and current, controlling the charging/recharging of the battery and/or controlling the environment of the battery so that the battery remains within its safe operating area.

According to various implementations, some aspects charging/discharging of the battery may be controlled by the management processor 220 and charge/discharge circuitry 230. For example, these components may control the charge/discharge rate and/or charge/discharge cycles of the battery. The management processor 220 may use information from the optical sensors and/or other information to make predictions and/or estimations regarding the state of the battery. These predictions and estimations may be developed using theoretical and/or empirical data and may be adaptable based on one or more of 1) measured internal or external parameters of the battery, e.g., strain, temperature, chemical composition, voltage, current, 2) operational state of the battery, e.g., state of charge/discharge, state of health, 3) external (environmental) parameters and/or 4) correlations between measured and/or environmental parameters and operational state.

In some cases, information based on measurement and/or analysis of various aspects of battery operation, e.g., the aspects including the measured internal or external parameters of the battery, operational state of the battery, external (environmental) parameters and/or correlations between measured and/or environmental parameters and operational state of the battery can be developed by the management processor 220 and provided to an operator via an electronic or printed report, e.g. over an external communication link 250. For example, the management processor 220 may compile, analyze, trend, and/or summarize the aspects, and/or may perform other processes based on various aspects of battery operation. In some configurations, the processes performed by the management processor include predicting and/or estimating the state of health of the battery, for example. The results of these processes and/or other information derived from monitoring the battery may be provided in a report that can be displayed graphically or textually or in any convenient form to a system operator and/or may be provided to another computer system for storage in a database and/or further analysis.

As a part of the analysis, measurements of strain may be used to monitor the state of health of a battery (or other mechanical structure). However, as discussed above, when strain values are measured using optical sensors such as FBG sensors, the measurement of strain may be confounded by a concurrent response of the FBG sensor to another parameter, such as temperature. Embodiments disclosed herein provide systems and methods for separating coupled parameters measured by FBG sensors by determining a compensation factor.

Figure 3:
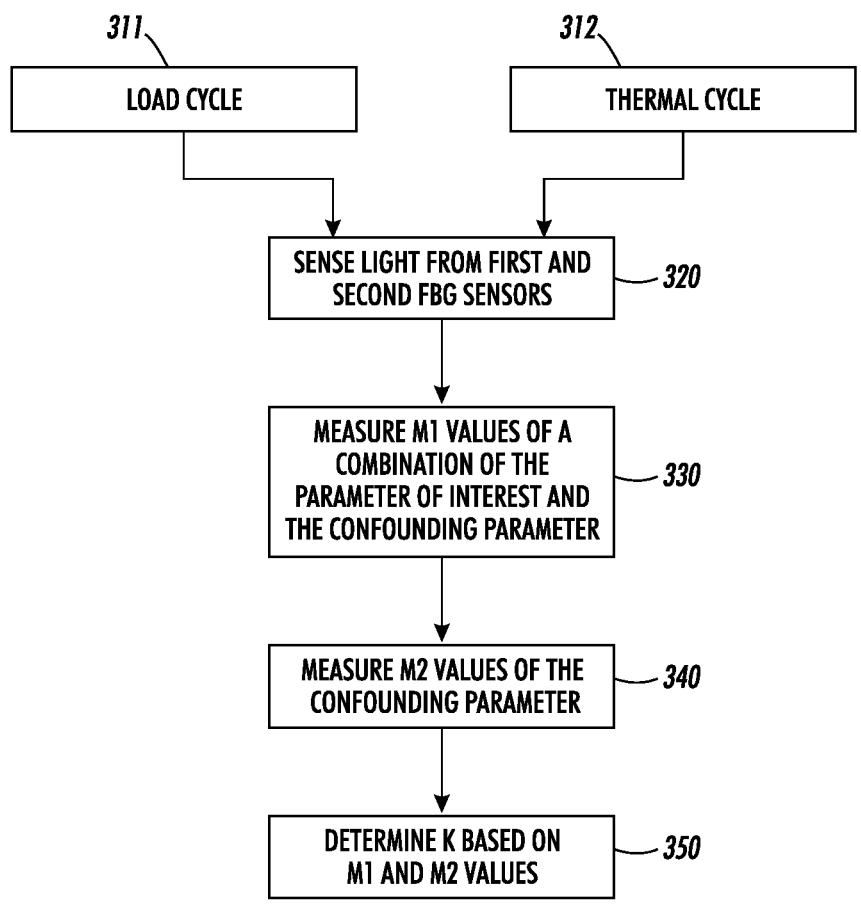
FIG. 3 is a flow diagram illustrating a process for determining an optimal compensation factor in accordance with some embodiments wherein the process may be implemented by the systems illustrated in FIG. 1 or 2.

FIG. 3 is a flow diagram illustrating an approach for determining the compensation factor based on thermal cycling 312 and/or on multiple load/unload cycles 311. In the case of a battery, charge/discharge cycles provide the load/unload cycles used to determine the compensation factor. Determining the compensation factor using the load/unload approach can be useful in situations where thermal cycling is not possible or not desirable.

Returning now to FIG. 3, light from the first and second FBG sensors is detected 320 and first and second electrical signals are generated in response to the detected light. The measured values $M_1$ and $M_2$ can be extracted 330, 340 from the first and second electrical signals, respectively. The values of $M_1$ are measurements of a combination of a parameter of interest (e.g., strain) and a confounding parameter (e.g., temperature, which may also happen to be a parameter of interest). The values of $M_2$ are measurements of the confounding parameter.

Values of $M_1$ and $M_2$ are measured over one or more thermal cycles 312 or over multiple load/unload cycles 311. The compensation factor K is determined 350 based on the measured values of $M_1$ and $M_2$.

Figure 4A:
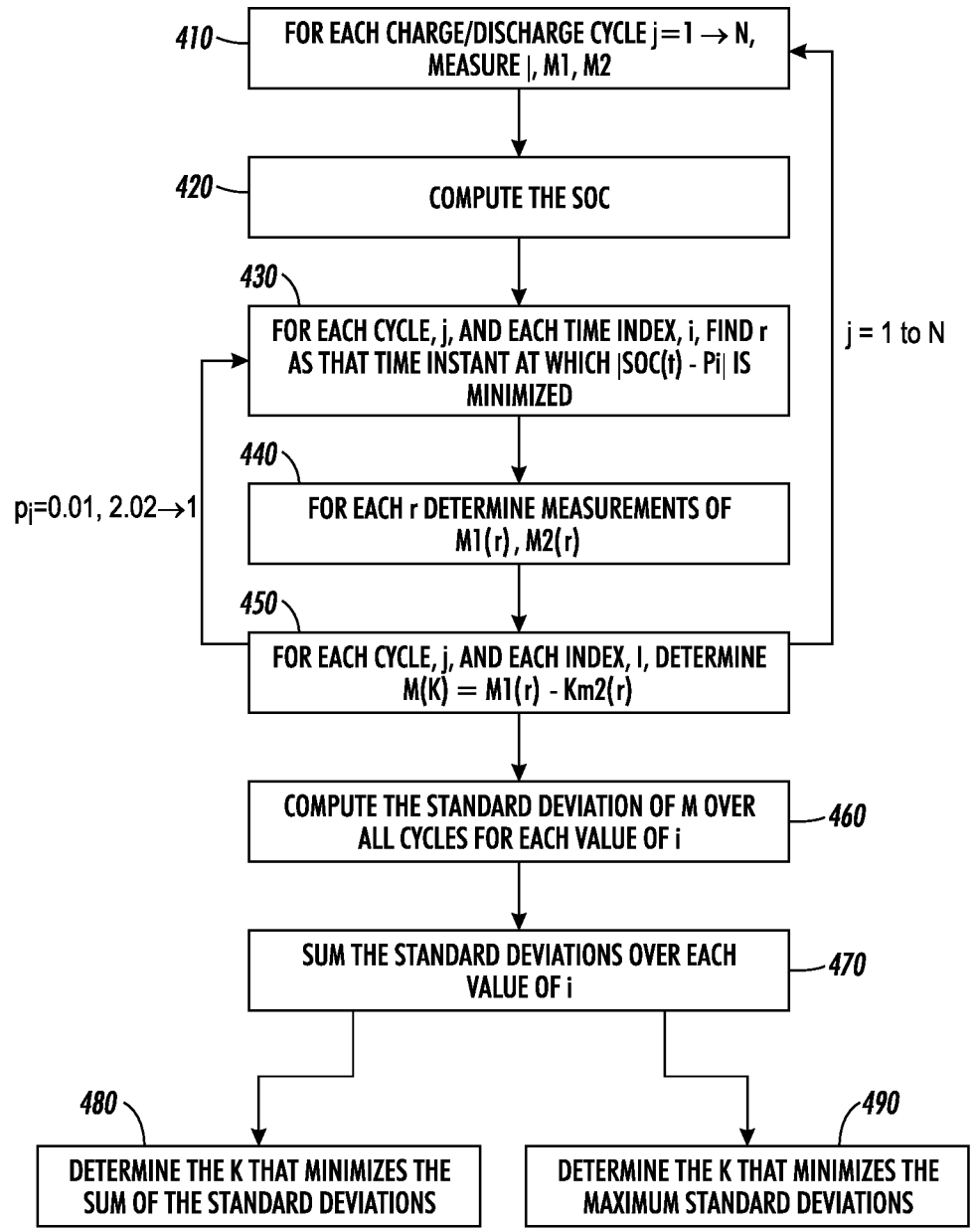
FIG. 4A is a flow diagram that illustrates in more detail an approach for determining the compensation factor of a battery or other mechanical structure based on multiple load/unload cycles of the structure in accordance with various embodiments.

The flow diagram of FIG. 4A illustrates in more detail an approach for determining the compensation factor of a battery or other mechanical structure based on multiple load/unload cycles of the structure. The flow diagram of FIG. 4A illustrates an example implementation of element 350 of FIG. 3 wherein the mechanical structure is a battery and the load/unload cycles are charge/discharge cycles of the battery.

For each charge/discharge cycle j=1 to N, multiple measurements 410 of the charge current, I, $M_1$, and $M_2$ are made, e.g. under conditions of constant charge and discharge currents. Let $I^j(t)$, $M_1^j(t)$ and $M_2^j(t)$ denote the measurements 410 for the jth cycle where t denotes the time of the measurement. Let [0.01 0.02 . . . 1] be a discretization of the interval [0,1]. Let $p_i$ denote the ith point in the interval. Therefore, $p_1=0.01$, $p_2=0.02$, and so on. For each cycle j, the state of charge 420, $SOC^j(t)=\Sigma_{i=0}^t I^j(i)\Delta T$ is computed where ΔT is the time difference between successive measurements. For each cycle, j, and each time index, i, $r=\mathrm{argmin}_t|SOC^j(t)-p_i|$ is determined 430. For this determination, r is the time instant, t, wherein the absolute value of the difference between the state of charge (SOC) and the discretization point is minimized. Thus, for the first time index i=1, discretization point $p_1$ is 0.01, and r is the time at which the state of charge (SOC) of the battery is at 1%; for the second time index, discretization point $p_2$ is 0.02, and r is the time at which the SOC is of the battery is 2%, etc. For each r, determine 440 $M_1^j(r)$ and $M_2^j(r)$. For each cycle, j, and each index, i, determine 450 $M(K,j,i)=M_1^j(r)-KM_2^j(r)$. Compute the standard deviation 460 of $M(K,j,i)$ over all cycles j at each point, $p_i$. To compute the standard deviation, first the mean $\mu(K,i)=1/N\Sigma_{j=1}^N M(K,j,i)$ is determined. Then, the standard deviation can be determined $$\sigma(K, i) = \sqrt{\left(\frac{1}{N}\Sigma_{j=1}^N (M(K, j, i) - \mu(K, i))^2\right)}.$$

Define an objective function which sums 470 the standard deviations of K over each value of i, $J(K)=\Sigma_i\sigma(K,i)$. Determine 480 the K that minimizes the sum of the standard deviations, $K_{opt}=\mathrm{argmin}_K J(K)$.

In some embodiments, $K_{opt}$ can be determined numerically by evaluating the objective function at different possible values of K. $K_{opt}$ is then set to be the value of K for which J is the least. Without loss of generality K can represent a vector of parameters (K2, ..., KN). In this case, to find the optimal vector $K_{opt}$, we can evaluate J for different combinations of (K2, ..., KN) and then set $K_{opt}$ to the be combination for which J is the least.

In an alternate process, determine 490 K that minimizes the maximum standard deviation of the standard deviations at the points $p_i$. The strain in the battery is determined using the measurements $M_1$, $M_2$, and $K_{opt}$.

Some embodiments rely on determining residual strain during the periods when the battery is at rest (not being charged or discharged) and/or has been at rest for a specified sufficient amount of time. In other words, $r=\mathrm{argmin}_t|SOC^j(t)-p_i|$ is computed for those time instants when the cell is completely at rest and has been at rest for a specified amount of time.

In the process outlined by the flow diagram of FIG. 4A, it will be appreciated σ(K,i) may be non-zero because the current $I(t)$ differs from one cycle to the next resulting in different temperature profiles over the course of multiple charge and discharge cycles. Alternatively or additionally, natural variations in experimental conditions may occur from cycle to cycle even though $I(t)$ is substantially identical for each cycle. In some embodiments, some minor controlled temperature fluctuations may be introduced during the charge and discharge cycles. These controlled temperature fluctuations cause σ(K,i) to be non-zero and may facilitate obtaining Kor.

Figure 4B:
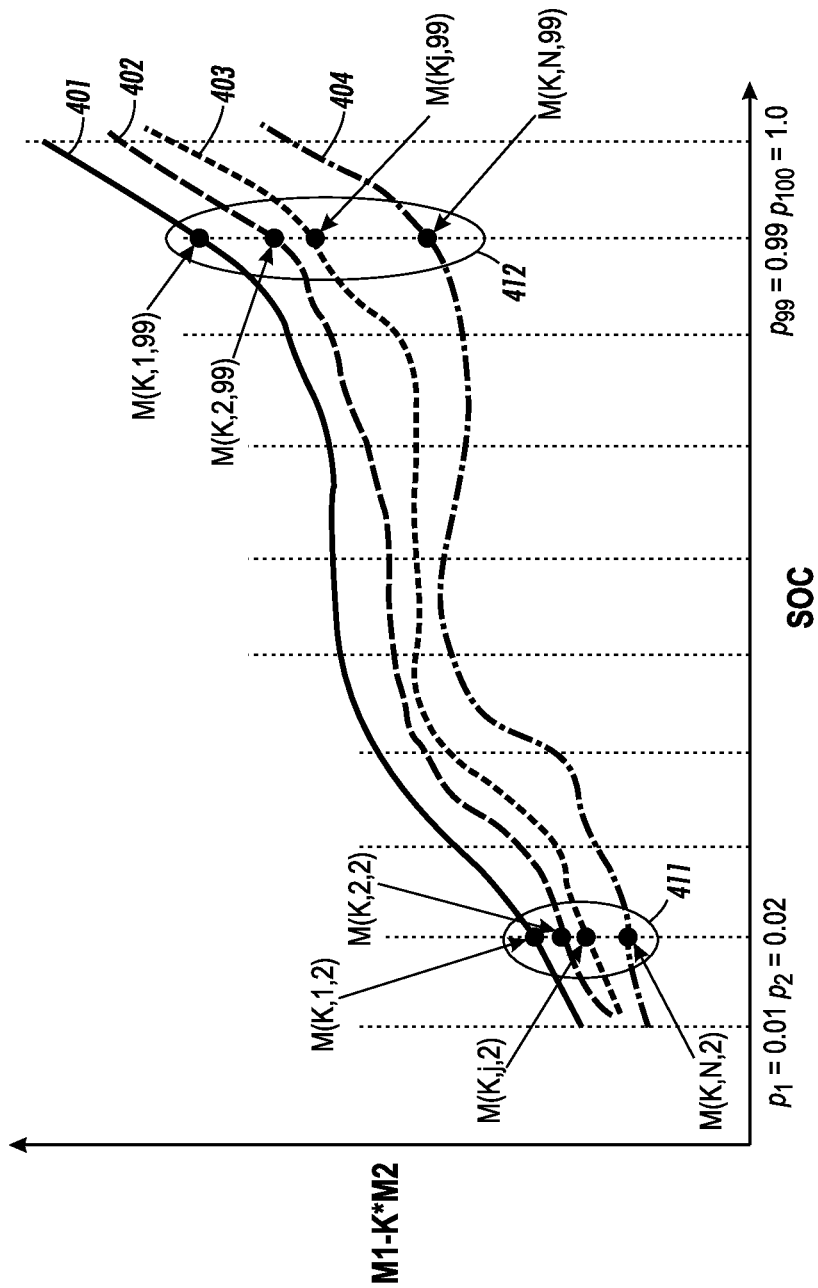
FIGS. 4B and 4C are graphs that illustrate in more detail the process for determining K outlined by the flow diagram of FIG. 4A.
Figure 4C:
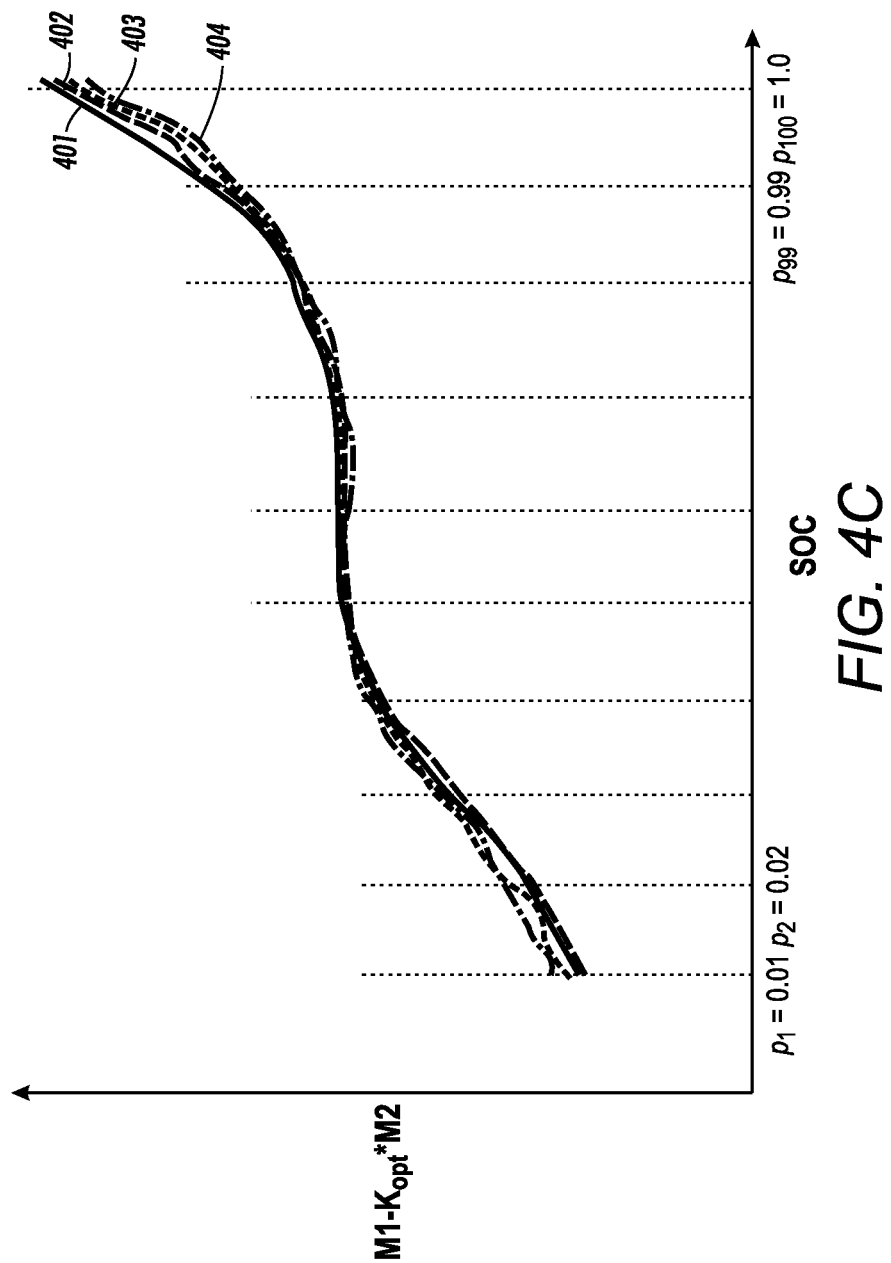

FIGS. 4B and 4C are graphs that illustrate in more detail the process for determining K outlined by the flow diagram of FIG. 4A. FIGS. 4B and 4C each show a family of traces of $M(K)=M_1-KM_2$ vs. SOC at discretization index points $p_i$, where $M_1$ and $M_2$ are measured from multiple cycles, j=1, . . . N. The family of traces shown in FIG. 4B have a relatively higher objective function, J(K) (sum of the standard deviations of the traces at the index points) when compared to the family of traces shown in FIG. 4C.

FIG. 4B shows traces 401-404 corresponding to M(K,j,i) vs. SOC at index points $p_i$, which are the discretization points of SOC for charge/discharge cycles 1, 2, j, and N, respectively. Trace 401 corresponds to M(K,1,i) for the first cycle j=1; trace 402 corresponds to M(K,2,i) for the second cycle; trace 403 corresponds to M(K,j,i) for the jth cycle; and trace 404 corresponds to M(K,N,i) for the Nth cycle. Points M(K,1,2), M(K,2,2), M(K,j,2), M(K,N,2) indicate points for the first, second, jth, and Nth cycles for discretization point p2=0.02. These points correspond to the value of $M=M_1-K^*M_2$ at which the SOC is closest to 2% for each cycle. Points M(K,1,99), M(K,2,99), M(K,j,99), M(K,N,99) indicate points for the first, second, jth, and Nth cycles for discretization point $p_9 9=0.99$. These points correspond to the value of $M=M_1-K^*M_2$ at which the SOC was closest to 99% for each cycle. The standard deviations for M(K,j,i) are determined at each discretization point, $p_i$, over all cycles j=1 to N. Thus, the standard deviation of the group of points 411 at $p_2$ is determined, the standard deviation of the group of points 412 at $p_{99}$ is determined along with the standard deviations at some or all of the other discretization points $p_1$, $p_3$-$p_{98}$, and $p_{100}$ (not specifically indicated in FIG. 4B). The objective junction J(K) is the sum of the standard deviations for each discretization point, $J(K)=\Sigma_i\sigma(K,i)=\sigma(K,1)+\sigma(K,2)+\sigma(K,3)+ \ldots \sigma(K,99)$. The minimum of J(K) corresponds to the situation wherein the traces for M(K,j,i) lie nearly on top of one another and provides an optimal value of K. FIG. 4B shows the family of traces 401-404 (corresponding to cycles 1, 2, j, N) with a suboptimal K wherein the objective function J(K) is not minimized. FIG. 4C illustrates the family of traces 401-404 with optimal $K=K_{opt}$ wherein the objective function J(K) is minimized.

Figure 5A:
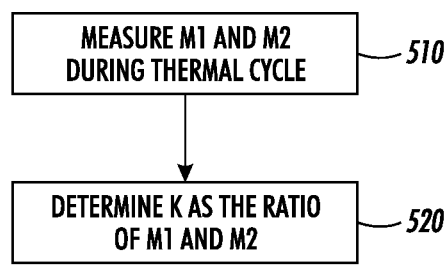
FIG. 5A is a flow diagram that illustrates in more detail an approach for determining the compensation factor for a battery based on thermal cycling in accordance with some embodiments.

The flow diagram of FIG. 5 illustrates in more detail an approach for determining the compensation factor of a battery based on thermal cycling. The flow diagram of FIG. 5 illustrates an example implementation of element 312 of FIG. 3 wherein strain is the parameter of interest, temperature is the confounding parameter.

The compensation factor, K, can be determined empirically by heating the battery at rest (not being charged or discharged) to various temperatures and measuring 510 $M_1$ and $M_2$. Because the cell is at rest, $M_1=K^*$Temperature. The temperature compensation factor, K, is determined 510 based on a ratio of $M_1$ and $M_2$, e.g., $$K = \frac{M_1}{M_2}.$$

Figure 5B:
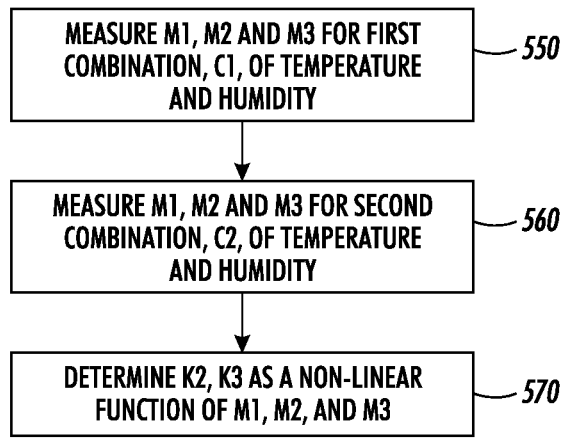
FIG. 5B is a flow diagram that illustrates in more detail an approach for determining multiple compensation factors for multiple confounding parameters based on measurements taken over one or more cycles that span a range of values of each of the confounding parameters.

The flow diagram of FIG. 5B illustrates an example implementation of element 312 of FIG. 3 wherein strain is the parameter of interest, temperature is a confounding Parameter2, and humidity is confounding Parameter3. In this example, the subsystem under test is a mechanical structure. $M_1$ is measured using the output of a first optical sensor which is sensitive to the parameter of interest (strain) and the confounding parameters temperatures and vibration, where $M_1$=value of Parameter 1+$K_2^*$value of Parameter2+ $K_3^*$value of Parameter3, or $M_1$=Strain+$K_2^*$Temperature+ $K_3^*$humidity. Measurement $M_2$ can be obtained from an optical sensor which is sensitive only to temperature and measurement $M_3$ can be obtained from an optical sensor which is sensitive only to humidity, $M_2$ Temperature and $M_3$ Humidity.

The compensation factor, $K_2$ for confounding Parameter2 (temperature), can be determined empirically by heating the mechanical structure at rest not being loaded and experiencing no humidity to various temperatures, for example inside an environmental chamber, and measuring $M_1$ and $M_2$. Because the mechanical structure is at rest, $M_1 = K_2 *$Temperature. The temperature compensation factor, $K_2$, is determined based on a ratio of $M_1$ and $M_2$, e.g., $$K_2 = \frac{M_1}{M_2}.$$

The compensation factor, $K_3$ for confounding Parameter3 (humidity), can be determined empirically subjecting the mechanical structure at rest not being loaded and at a known constant temperature to different amounts of humidity and measuring $M_1$ and $M_3$. Because the mechanical structure is at rest, $M_1 = K_2 *$Temperature$+K_3 *$Humidity. The humidity compensation factor, $K_3$, is determined based on a ratio of $M_1 - K_2 *$temperature and $M_3$, e.g., $$K_3 = \frac{M_1 - K_2 * \text{Temperature}}{M_3} \text{ or}$$

$$K_3 = \frac{M_1 - K_2 * M_2}{M_3} \text{ since } M_2 = \text{Temperautre.}$$

More generally $M_2$ and $M_3$ could measure known combinations of temperature and humidity. For example, $M_2 = \alpha *$Temperature$+\beta *$Humidity and $M_3 = \gamma *$Temperature$+\delta *$Humidity where $\alpha, \beta, \gamma, \delta$ are known and chosen in such a way that $$\begin{bmatrix} \alpha & \beta \\ \gamma & \delta \end{bmatrix}$$

is invertible. Therefore, we have $$\text{Temperature} = \frac{1}{\alpha\delta - \gamma\beta}(\delta M_2 - \beta M_3)$$

$$\text{Humidity} = \frac{1}{\alpha\delta - \gamma\beta}(-\gamma M_2 + \alpha M_3)$$

Therefore, we can write $$M_1 = \text{strain} + K_2 * \frac{1}{\alpha\delta - \gamma\beta}(\delta M_2 - \beta M_3) + K_3 * \frac{1}{\alpha\delta - \gamma\beta}(-\gamma M_2 + \alpha M_3)$$

The parameters $K_2$ and $K_3$ can be determined by subjecting the mechanical structure to two different combinations, C1 and C2, of temperature and humidity, under no loading (strain=0), and measuring M1, M2, and M3 550, 560. Then K2 and K3 can be determined 570 as follows $$\begin{bmatrix} K_2 \\ K_3 \end{bmatrix} =$$

$$\begin{bmatrix} \frac{1}{\alpha\delta - \gamma\beta}(\delta M_2(C1) - \beta M_3(C1)) & \frac{1}{\alpha\delta - \gamma\beta}(-\gamma M_2(C1) + \alpha M_3(C1)) \\ \frac{1}{\alpha\delta - \gamma\beta}(\delta M_2(C2) - \beta M_3(C2)) & \frac{1}{\alpha\delta - \gamma\beta}(-\gamma M_2(C2) + \alpha M_3(C2)) \end{bmatrix}^{-1}$$

$$\begin{bmatrix} M_1(C1) \\ M_1(C2) \end{bmatrix}$$

where Mi(C1) and Mi(C2) denote the measurements Mi at combination 1 of temperature and humidity and combination 2 of temperature and humidity, respectively. The right hand side of the above expression can be thought of as a generalized ratio of M1 and M2, M3.

The thermal cycling and/or charge/discharge methods described above may be used, for example, during the formation stage of the battery in which the battery is subjected to charge and discharge cycles in order to slowly form the solid-electrolyte interphase.

EXAMPLES

Figure 6A:
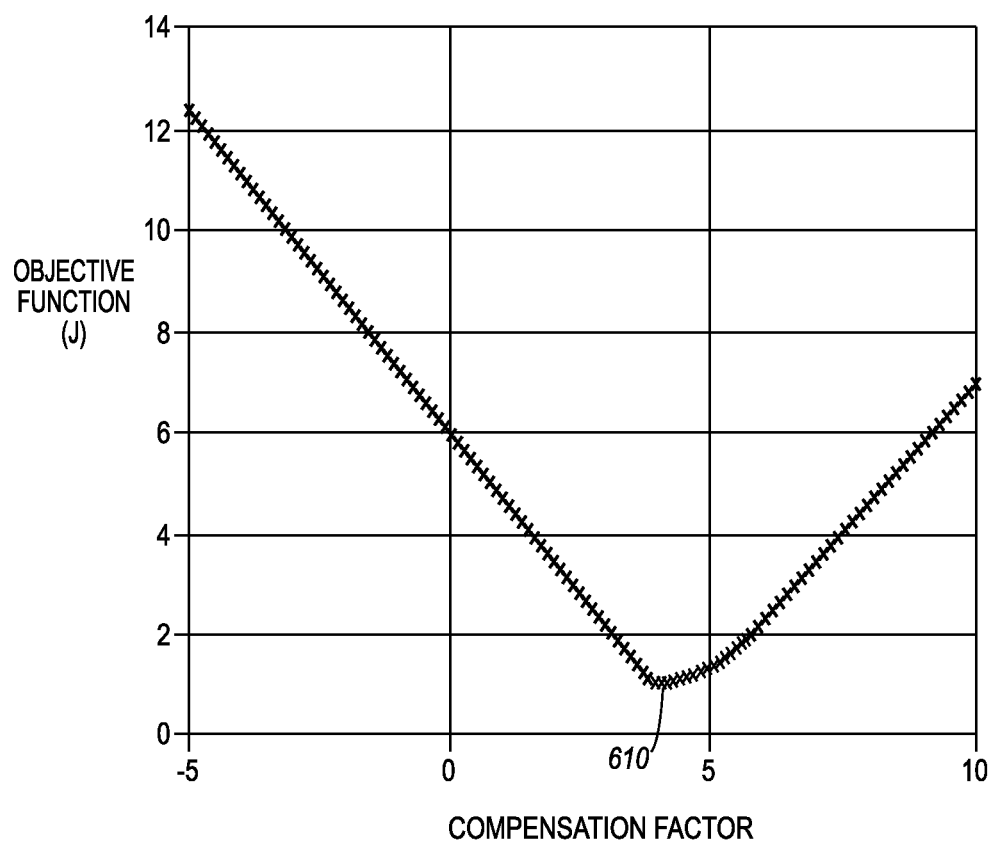
FIGS. 6A and 6B are graphs that show the value of the objective function as a function of the compensation factor, K, for a first experiment based on charge/discharge cycling.
Figure 6B:
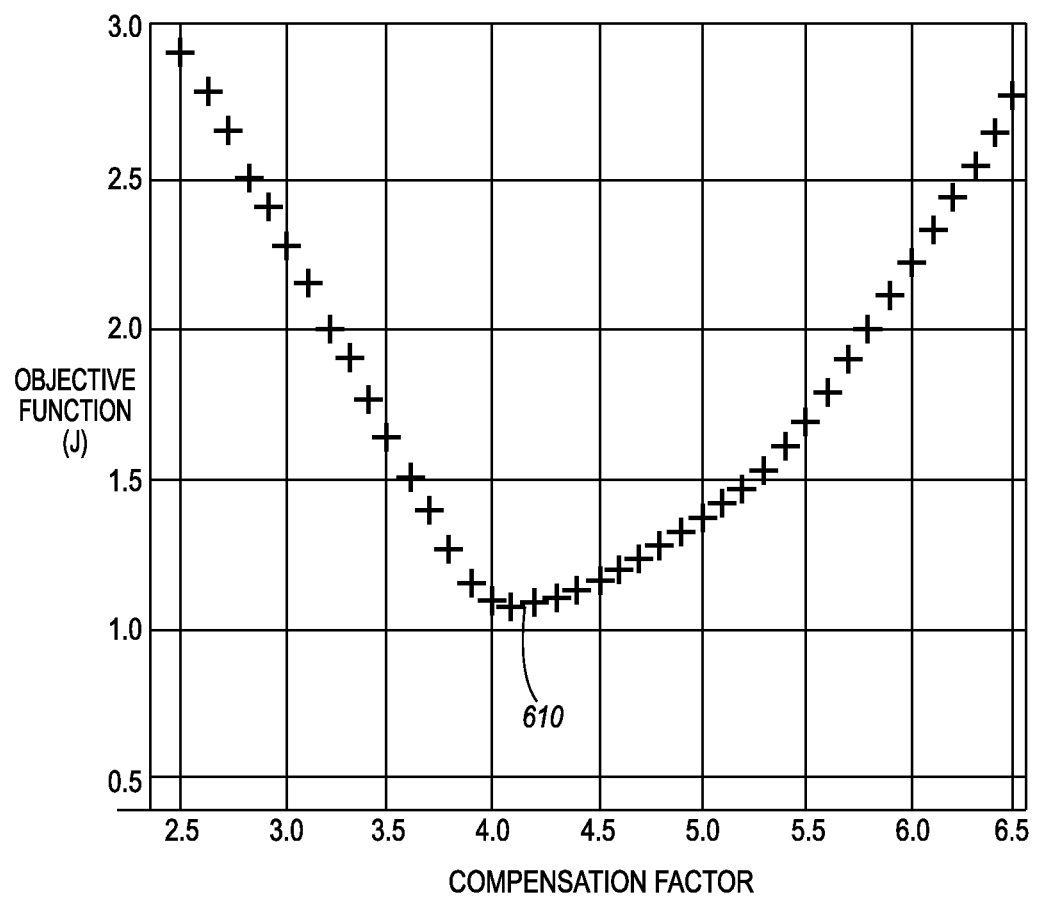
Figure 7A:
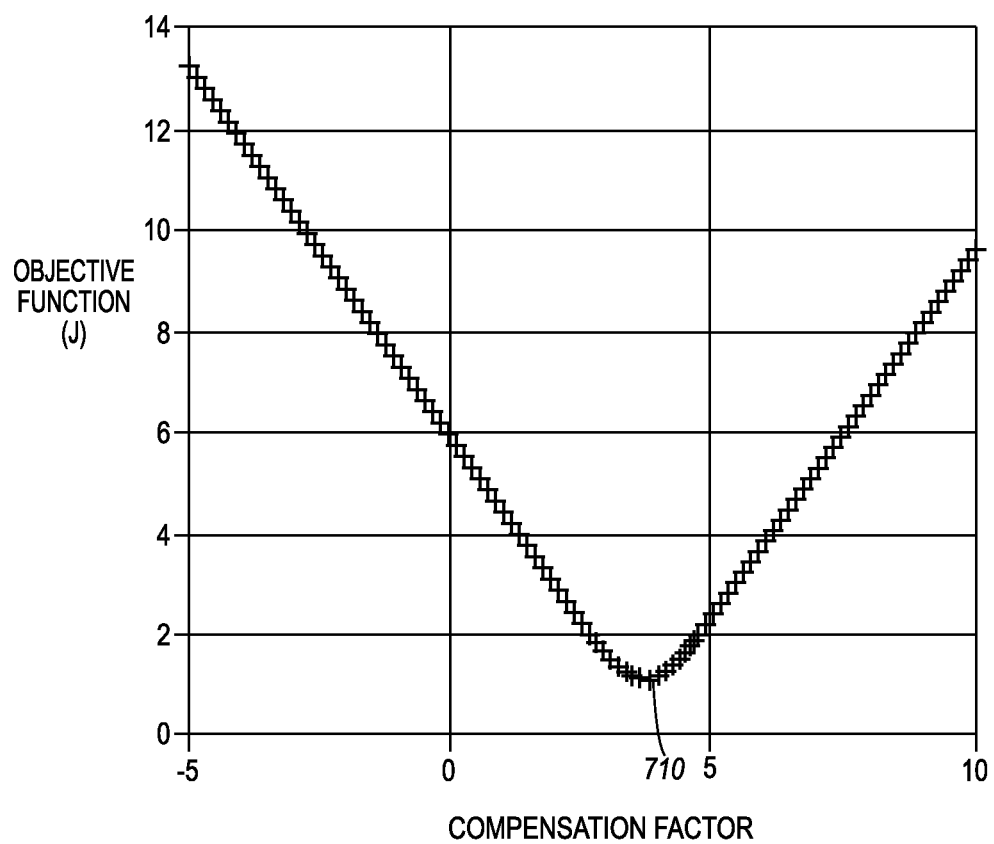
FIGS. 7A and 7B are graphs that show the value of the objective function as a function of the compensation factor, K, for a second experiment based on charge/discharge cycling.
Figure 7B:
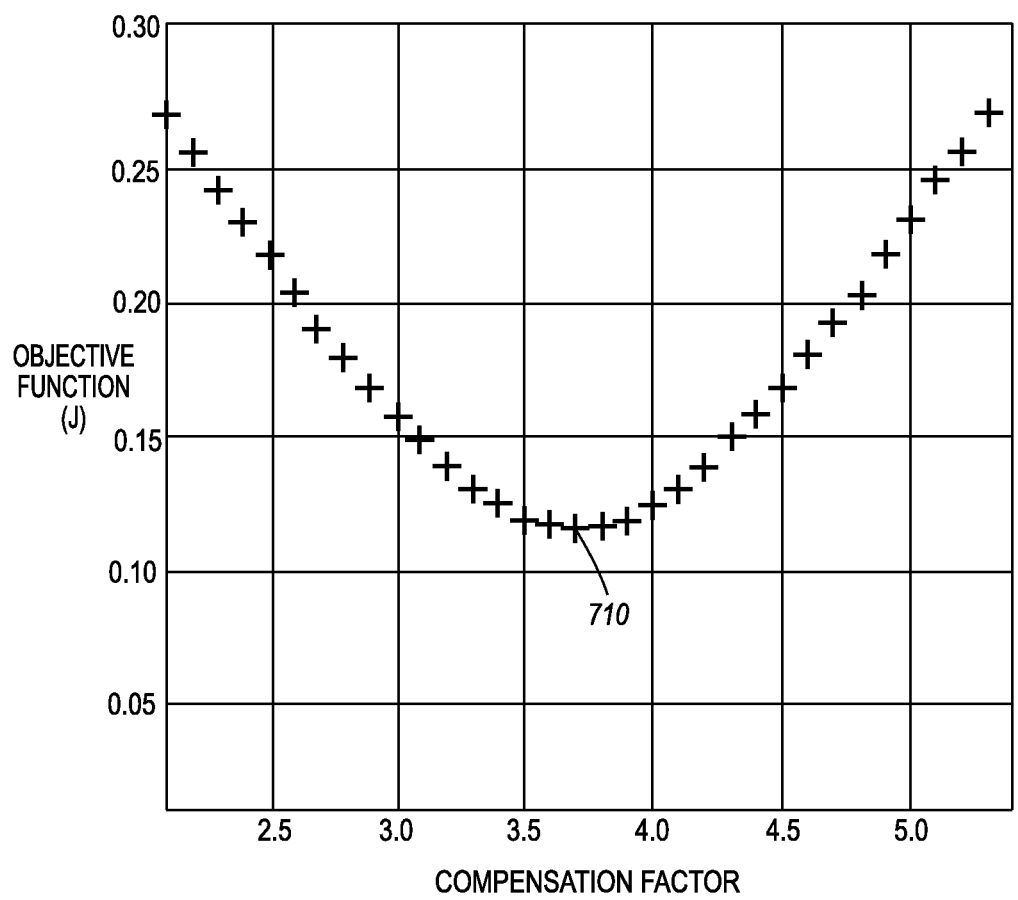

Two sets of charge and discharge experiments (referred to as Experiment 1 and Experiment 2) were performed and the optimal temperature compensation factors were determined according to the charge/discharge method described above with reference to FIGS. 4A through 4C. In Experiments 1 and 2, the optimal compensation factor K determined was 4.1 and 3.7, respectively, for the battery tested. FIGS. 6A and 6B show the value of the objective function as a function of the compensation factor, K, for Experiment 1. FIG. 6B is a zoomed inversion of FIG. 6A at the optimal compensation factor 610. FIGS. 7A and 7B show the value of the objective function as a function of the compensation factor K for Experiment 2. FIG. 7B is a zoomed in version of FIG. 7A at the optimal compensation factor 710.

Figure 8A:
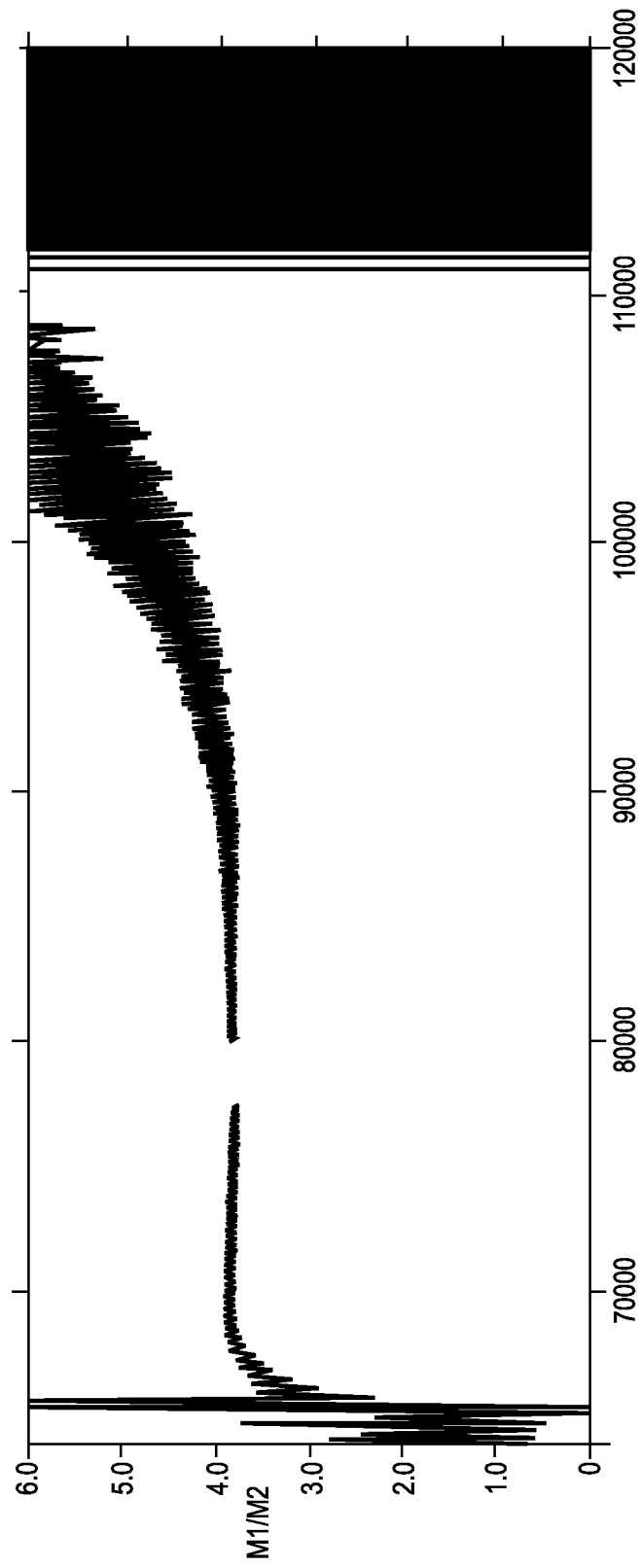
FIGS. 8A and 8B are graphs that show the optimal compensation factor determined by the thermal cycling.
Figure 8B:
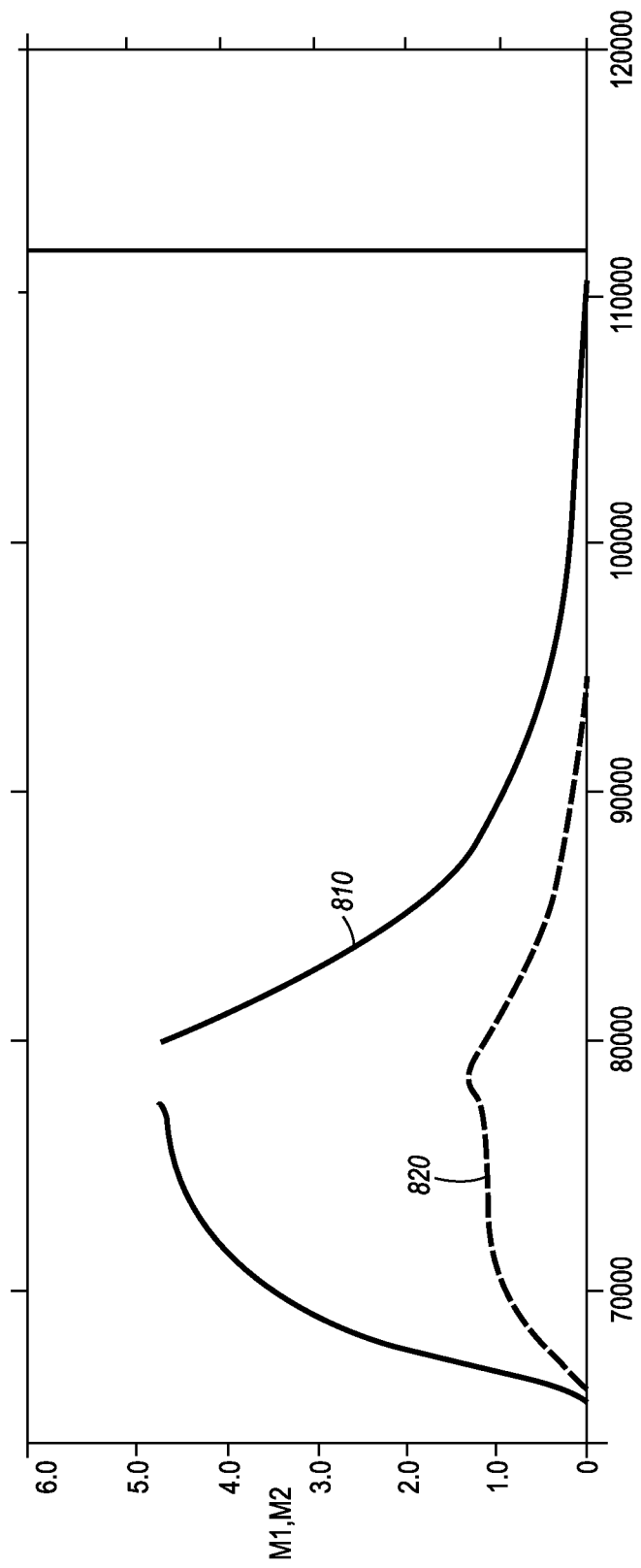

Additionally, the compensation factor for the battery was determined using the thermal cycling process described above with reference to FIG. 5. As shown in FIGS. 8A and 8B, the optimal compensation factor determined by the thermal cycling method was 3.88. FIG. 8A shows the ratio of $M_1$ to $M_2$ along the y axis with respect to measurement points. FIG. 8B shows traces for $M_1$ 810 and $M_2$ 820. In steady state (relatively constant $M_1/M_2$) between points 70000 and 80000 which represent different points in time the ratio of $M_1$ to $M_2$ is approximately 3.88. The difference between the two approaches (charge/discharge cycling vs. thermal cycling) is less than 6%.

Approaches disclosed herein provide systems and methods for determining the optimal compensation factor, for decoupling coupled parameters, and for using the de-coupled parameters to monitor and/or manage the operation of a mechanical structure. Where load/unload cycling is used to determine the optimal compensation factor, there is no need to conduct thermal experiments on the mechanical structure being tested. The compensation factor obtained by these approaches may be optimal for the unique characteristics of the particular mechanical structure, e.g., battery cell, and/or the installation configuration. Once initially determined, the optimal compensation factor may be periodically re-determined to adjust for changes in the mechanical structure. Additionally, changes in the optimal compensation factor can be used as a measure or indication of degradation of the mechanical structure. Thus, periodic determination of the optimal compensation factor might provide indication of degradation the battery or other mechanical structure.

According to some embodiments, the compensation factor for a battery can be determined using the thermal cycling approach based on controlled thermal experiments, for example during formation process in order to slowly build up the solid electrolyte interphase (SEI) at the electrodes. Additionally or alternatively, the charge/discharge technique may be employed for determination of the optimal compensation factor during battery cell formation.

Some embodiments involve systems and methods that determine the compensation factor using standard charge and discharge cycles leveraging the variation in experimental conditions from cycle to cycle and/or by adding some controlled/defined temperature fluctuations.

Approaches disclosed above have been explained with reference to lithium-ion batteries as the mechanical structure for which an optimal compensation factor for separating coupled parameters strain and temperature is determined. The approaches are applicable to a variety of systems undergoing loading accompanied by thermal changes, or where thermal changes lead to structural changes. The approaches discussed herein may be used to determine compensation factors that separate various overlapping parameters other than strain and temperature that can be detected using optical sensors, such as chemical concentration, current, and voltage.

Figure 9:
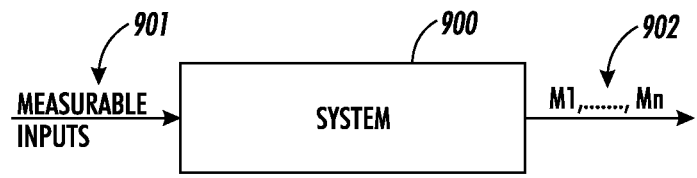
FIG. 9 depicts a physical or cyber physical system that includes one or more measureable inputs 901 and n outputs for which one or more compensation factors can be determined.

FIG. 9 depicts a physical or cyber physical system 900, wherein a physical system involves physical processes and a cyber physical system integrates physical processes with computation and/or networking. In some implementations of a cyber physical system, embedded computers and networks monitor parameters of the physical processes using sensors and the embedded computers and networks control the operation of the cyber physical system using feedback signals that are based on the sensed parameters.

The system 900 includes one or more measureable inputs 901 and n outputs M1 . . . Mn 902. For this system, there exists a quantity Q which is a known function of the inputs to the system. Furthermore, there exists a parameter of interest Parameter 1 which as a function of Q is invariant under different inputs. In the case of a battery, a measureable input may be current, for example, Q may be state of charge of the battery, and a parameter of interest may be strain. In the case of a physical system, e.g., a bridge, the measureable inputs may be force applied to the bridge, for example, Q may be the state of loading of the bridge, and a parameter of interest may be strain. In the case of a cyber physical system, such as a computer controlled machining system, the measureable inputs may be spindle strain/acceleration, temperature and cutting fluid pH, for example, Q may be the spindle speed and the parameter of interest may be spindle rotor imbalance.

Figure 10:
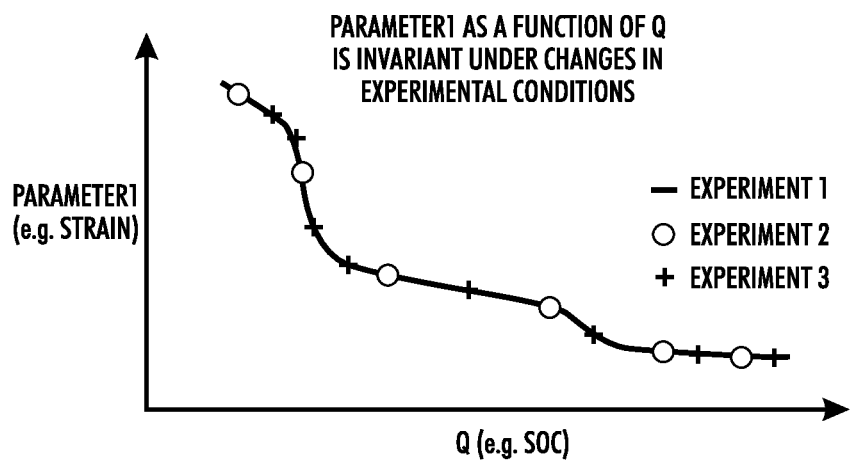
FIG. 10 is a graph illustrating the invariancy of the parameter of interest with respect to Q, where Q is a function of the measurable input, e.g., current.

FIG. 10 is a graph illustrating the invariancy of the parameter of interest, e.g., strain, with respect to Q, e.g., state of charge, where Q is a function of the measurable input, e.g., current. The parameter of interest is invariant as a function of Q under changes of the experimental conditions. The condition of invariancy of the parameter of interest as a function of Q allows a compensation factor for one or more parameters that confound the measurement of the parameter or interest to be determined. A first optical sensor that is sensitive to a parameter of interest (Parameter 1), such as strain, temperature, chemical composition, vibration, or acceleration and to one or more confounding parameters (Parameter2 . . . ParameterN), such as strain, temperature, chemical composition, vibration or acceleration, is disposed within or on the physical or cyber-physical system. In one example, strain may be a parameter of interest and temperature is a confounding parameter for strain. As another example, vibration at a particular frequency is a parameter of interest, and dynamic, higher frequency vibration may be a confounding parameter. Second, third, . . . . Nth optical sensors that are sensitive only to the confounding parameters Parameter2, Parameter3, . . . ParameterN, respectively, are disposed within or on the physical or cyber-physical system. Measurement circuitry measures M1 in response to light scattered by the first optical sensor where $M_1$=value of Parameter1+g(value of Parameter2, value of Parameter3, . . . value of ParameterN, $K_1, K_2 \ldots K_M$) where g is a known function and $K_1, K_2, \ldots K_M$ are unknown parameters. The measurement circuitry measures $M_j$=a value of parameter j in response to light scattered by the jth optical sensor, wherein j is greater than or equal to 2. The compensation circuitry determines compensation factors, $K_1, K_2 \ldots K_M$ for the confounding parameters based on measurements of $M_1, M_2, \ldots M_N$ taken over multiple load/unload cycles or taken over multiple measurable sequences of inputs to the subsystem that result in different measurement sequences of $M_1, M_2, \ldots M_N$.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. A method, comprising:
    sensing light scattered by a first optical sensor disposed on or within a battery;
    sensing light scattered by one or more second optical sensors disposed on or within the battery;
    charge/discharge cycling or thermal cycling the battery;
    during the cycling:
        measuring $M_1$ in response to sensing light scattered by the first optical sensor, where $M_1$=a value of Parameter1+K*a value of Parameter2 and Parameter1 is a parameter of interest and Parameter 2 is a confounding parameter; and
        measuring $M_2$ in response to sensing light scattered by one of the second optical sensors, where $M_2$=a value of Parameter 2; and
    determining a compensation factor, K, for the confounding parameter based on $M_1$ and $M_2$ measured during the cycling.

2. The method of claim 1, wherein the cycling comprises thermal cycling and/or cycling at varying charge and discharge rates that is performed during the formation stage of battery where a solid electrolyte interphase is slowly formed at electrodes of the battery.

3. The method of claim 1, wherein determining the compensation factor comprises determining the compensation factor using statistical analysis of measurements obtained during charge/discharge cycling at varying charge and discharge rates that is performed during the formation stage of battery where a solid electrolyte interphase is slowly formed at electrodes of the battery.

4. The method of claim 3, further comprising introducing controlled temperatures variations during the charge/discharge cycles.

5. The method of claim 1, wherein:
determining the compensation factor comprises measuring $M_1$ and $M_2$ during thermal cycling the battery while the battery is at rest and is not being charged or discharged; and
calculating K as a ratio of $M_1$ and $M_2$.

6. The method of claim 1, further comprising:
periodically determining K over a period of time; and
determining a degradation state of the battery based on a change in K over the period of time.

7. The method of claim 1, further comprising determining the compensation factor based on statistical analysis of $M_1$ and $M_2$ taken over the multiple charge/discharge cycles of the battery.

8. The method of claim 1, further comprising determining the compensation factor based on a ratio of $M_1$ and $M_2$ taken over the one or more thermal cycles of the battery.

9. The method of claim 1, wherein the parameter of interest is strain and the confounding parameter is temperature or chemical concentration.

10. The method of claim 1, further comprising:
using the compensation factor to determine the parameter of interest for the battery; and
determining a state of health of the battery based on the parameter of interest.

11. The method of claim 10, controlling one or both of the charge/discharge cycles of the battery and the environment of the battery based on the state of health of the battery.

12. The method of claim 10, further comprising:
periodically determining the compensation factor the battery over time; and
detecting degradation of the battery based on a change in the compensation factor over time.

13. The method of claim 1, wherein the optical sensors are fiber Bragg grating sensors.

14. The method of claim 1, wherein the parameter of interest is strain, temperature, chemical composition, vibration, humidity, or acceleration and each confounding parameter is different from the parameter of interest and is strain, temperature, chemical composition, vibration, humidity, or acceleration.

* * * * *